United States Patent
Chen et al.

(10) Patent No.: US 12,204,763 B2
(45) Date of Patent: Jan. 21, 2025

(54) METHOD AND NON-TRANSITORY COMPUTER-READABLE STORAGE MEDIUM AND APPARATUS FOR DYNAMICALLY UPDATING OPTIMIZATION READ VOLTAGE TABLE

(71) Applicant: Silicon Motion, Inc., Zhubei (TW)

(72) Inventors: Chun-Yi Chen, Hsinchu County (TW); Hsiao-Te Chang, Zhubei (TW)

(73) Assignee: SILICON MOTION, INC., Zhubei (TW)

( * ) Notice: Subject to any disclaimer, the term of this patent is extended or adjusted under 35 U.S.C. 154(b) by 78 days.

(21) Appl. No.: 18/080,852

(22) Filed: Dec. 14, 2022

(65) Prior Publication Data

US 2023/0221873 A1    Jul. 13, 2023

Related U.S. Application Data

(60) Provisional application No. 63/298,287, filed on Jan. 11, 2022.

(30) Foreign Application Priority Data

Apr. 21, 2022   (CN) .......................... 202210420246.9

(51) Int. Cl.
*G06F 3/00* (2006.01)
*G06F 3/06* (2006.01)

(52) U.S. Cl.
CPC .......... *G06F 3/0619* (2013.01); *G06F 3/0653* (2013.01); *G06F 3/0659* (2013.01); *G06F 3/0679* (2013.01)

(58) Field of Classification Search
None
See application file for complete search history.

(56) References Cited

U.S. PATENT DOCUMENTS 10,347,344 B2    7/2019   Malshe et al.
11,210,210 B2   12/2021  Jia et al.
(Continued)

FOREIGN PATENT DOCUMENTS

CN    107452421 B    6/2020
CN    111863097 A   10/2020
(Continued)

OTHER PUBLICATIONS

Search Report issued in Taiwan priority application 111115127, dated Jun. 18, 2022.

*Primary Examiner* — Midys Rojas
(74) *Attorney, Agent, or Firm* — Birch, Stewart, Kolasch & Birch, LLP (57) ABSTRACT

The invention relates to a method, a non-transitory computer-readable storage medium and an apparatus for dynamically updating an optimization read voltage (RV) table. The method includes: obtaining a data-read transaction and replying with the data-read transaction to a host side after listening to a first request for read-performance data, which is issued by the host side, thereby enabling the data-performance transaction to be used in an update of the optimization RV table for a designated memory-cell type; and programming multiple records of an updated optimization RV table for the designated memory-cell type into a designated location of the NAND-flash module after listening to a second request for updating the optimization RV table for the designated memory-cell type, which is issued by the host side. The data-read transaction includes a current environmental parameter of a NAND-flash module, the designated memory-cell type and a bit error rate (BER). Each record includes one set of RV parameters and an environmental parameter associated with the set of RV parameters.

20 Claims, 8 Drawing Sheets

(56) References Cited

U.S. PATENT DOCUMENTS

| | | |
|---|---|---|
| 2015/0085571 A1 | 3/2015 | Hu et al. |
| 2017/0345489 A1 | 11/2017 | Zeng et al. |
| 2019/0051361 A1 | 2/2019 | Park |
| 2020/0201569 A1* | 6/2020 | Hsiao ............... G11C 29/36 |

FOREIGN PATENT DOCUMENTS

| | | |
|---|---|---|
| TW | 201528274 A | 7/2015 |
| TW | 201911057 A | 3/2019 |

\* cited by examiner

METHOD AND NON-TRANSITORY COMPUTER-READABLE STORAGE MEDIUM AND APPARATUS FOR DYNAMICALLY UPDATING OPTIMIZATION READ VOLTAGE TABLE

CROSS-REFERENCE TO RELATED APPLICATIONS

This application claims the benefit of priority to U.S. Provisional Application Ser. No. 63/298,287, filed on Jan. 11, 2022; and Patent Application No. 202210420246.9, filed in China on Apr. 21, 2022; the entirety of which is incorporated herein by reference for all purposes.

BACKGROUND

The disclosure generally relates to storage devices and, more particularly, to a method, a non-transitory computer-readable storage medium and an apparatus for updating an optimization read voltage table.

Flash memory devices typically include NOR flash devices and NAND flash devices. NOR flash devices are random access—a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. To improve the accuracy rate of reading data has always been an important issue affecting the overall system performance of the flash memory controller. Thus, it is desirable to have a method, a non-transitory computer-readable storage medium and an apparatus for dynamically updating an optimization read voltage table to improve the accuracy rate of reading data.

SUMMARY

In an aspect of the invention, an embodiment introduces a method for dynamically updating an optimization read voltage (RV) table to include: obtaining a data-read transaction and replying with the data-read transaction to a host side after listening to a first request for read-performance data, which is issued by the host side, thereby enabling the data-performance transaction to be used in an update of the optimization RV table for a designated memory-cell type; and programming multiple records of an updated optimization RV table for the designated memory-cell type into a designated location of the NAND-flash module after listening to a second request for updating the optimization RV table for the designated memory-cell type, which is issued by the host side.

In another aspect of the invention, an embodiment introduces a non-transitory computer-readable storage medium having stored therein program code that, when loaded and executed by a micro-controller unit (MCU) of a flash controller, causes the MCU to perform the above method for dynamically updating the optimization RV table.

In still another aspect of the invention, an embodiment introduces an apparatus for dynamically updating an optimization RV table to include: a flash interface (I/F), coupled to a NAND-flash module; and a MCU, coupled to the flash I/F. The MCU is arranged operably to: obtain a data-read transaction and reply with the data-read transaction to a host side after listening to a first request for read-performance data, which is issued by the host side, thereby enabling the data-performance transaction to be used in an update of the optimization RV table for a designated memory-cell type; and program multiple records of an updated optimization RV table for the designated memory-cell type into a designated location of the NAND-flash module after listening to a second request for updating the optimization RV table for the designated memory-cell type, which is issued by the host side.

The data-read transaction includes a current environmental parameter of a NAND-flash module, the designated memory-cell type and a bit error rate (BER). Each record includes one set of RV parameters and an environmental parameter associated with the set of RV parameters.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
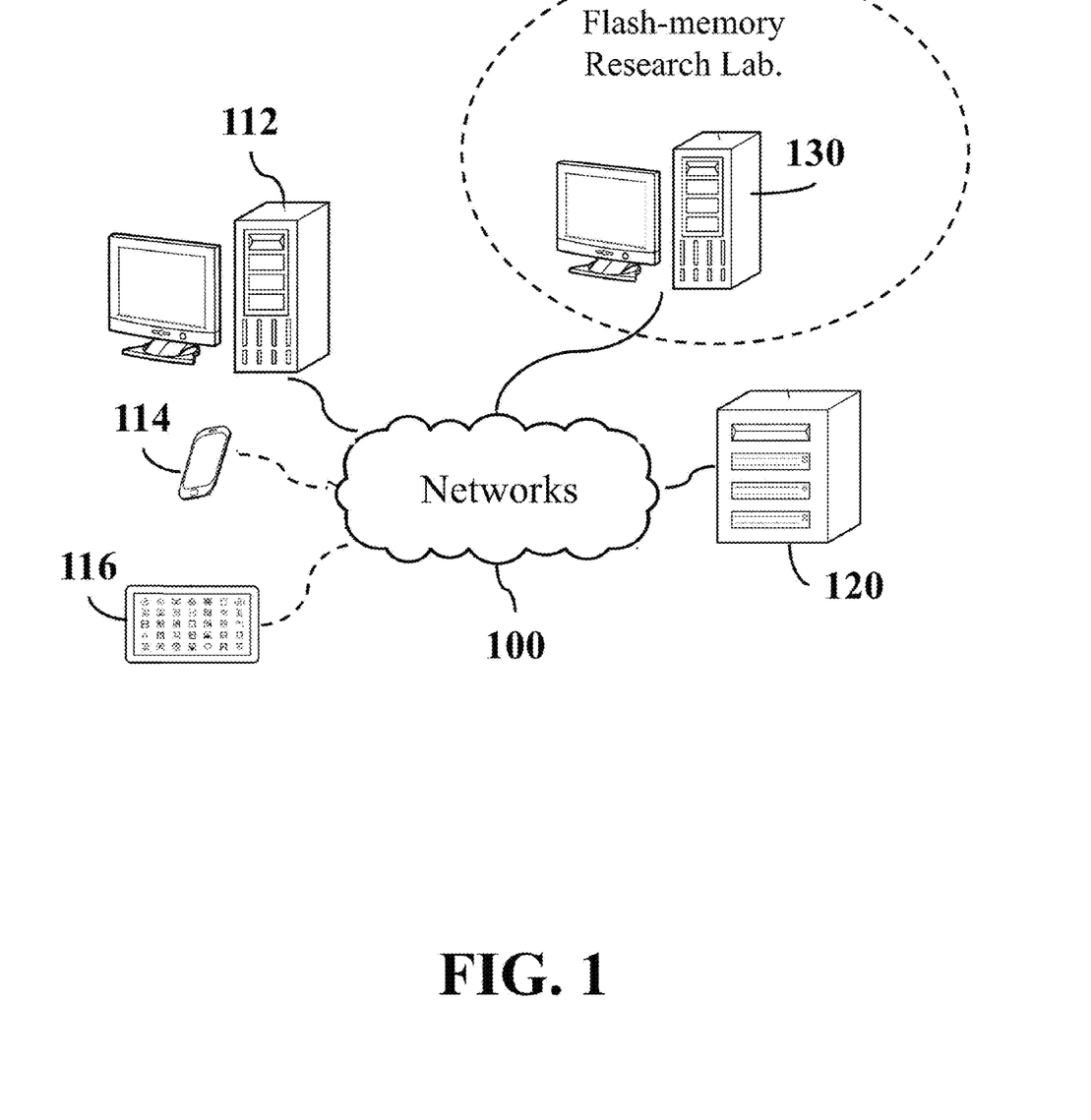
FIG. 1 is a schematic diagram of a network environment according to an embodiment of the invention.

The present invention introduces a mechanism for dynamically updating an optimization read voltage (RV) table that can be applied to NAND-flash storage devices in computation equipment and cloud storage systems in the network environment. The optimization RV table is used during data reads from a NAND-flash storage device. The NAND-flash storage device may be a NAND-flash card, a NAND-flash memory module, a solid state drive (SSD), or others. Refer to FIG. 1. The computation equipment may be the personal computer (PC) 112, the mobile phone 114, the tablet PC 116, a laptop PC, a digital camera, a digital recorder or other consumer electronic product that is equipped with a NAND-flash card, a NAND-flash memory module, an SSD or any combination thereof for storing various user data, such as digital files, high-resolution images, video files, etc. The computation equipment may upload a wide range of user data to the cloud storage system 120 for storage and download user data from the cloud storage system 120, which will be processed by a variety of applications. The cloud storage system 120 may include one or more redundant array of independent disks (RAIDs) and each RAID is composed of multiple SSDs.

Figure 2:
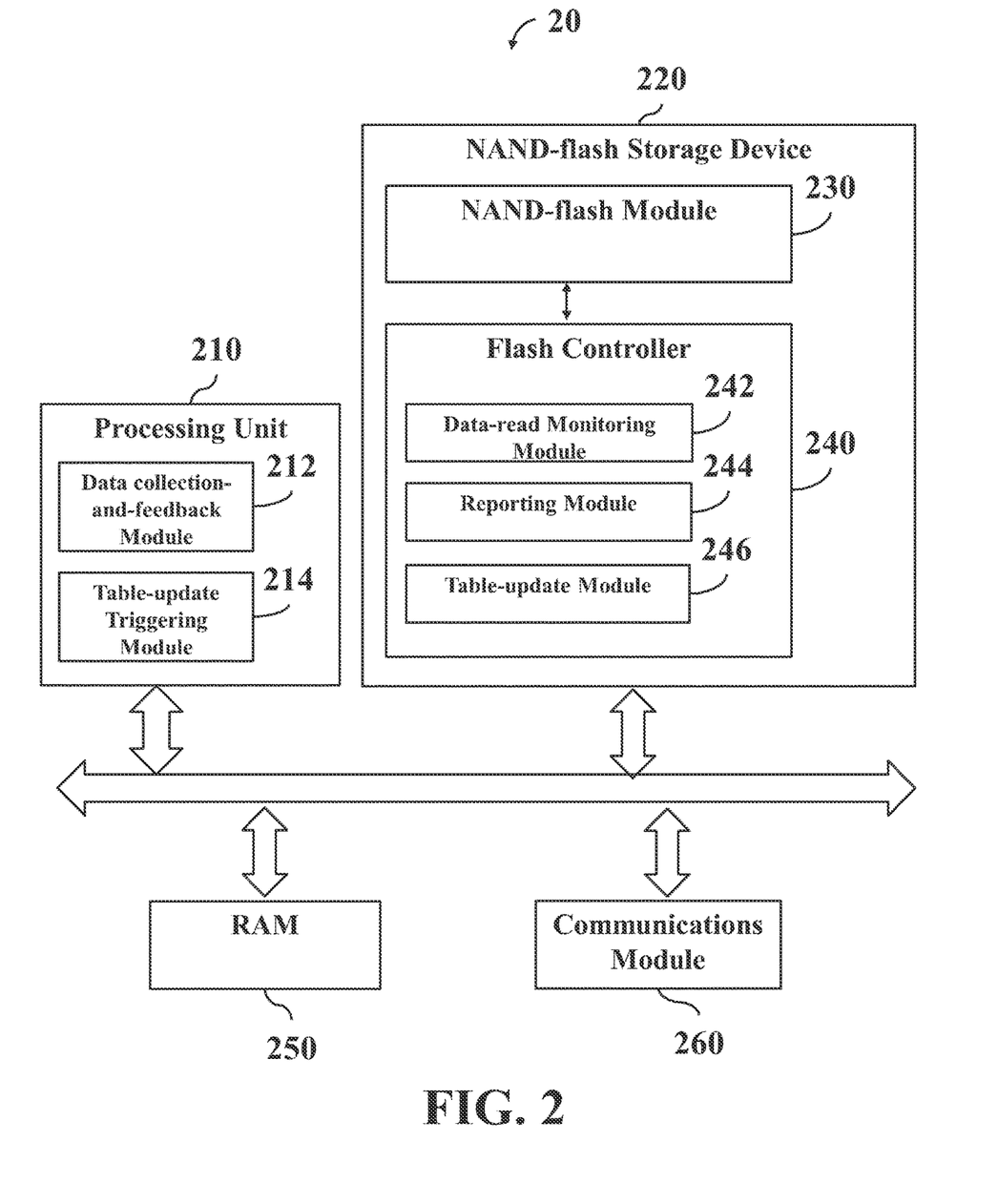
FIG. 2 is a block diagram of a computation equipment according to an embodiment of the invention.

Refer to FIG. 2 showing an embodiment of the hardware architecture of the computation equipment 20 (such as the PC 112, the mobile phone 114, the tablet PC 116, etc.). The processing unit 210, the NAND-flash storage device 220, the random access memory (RAM) 250 and the communications interface (I/F) 260 may be disposed in the computation equipment 210 and are connected each other through a bus architecture. The processing unit 210 (may be referred to as a host side) may be implemented in numerous ways, such as with general-purpose hardware (e.g., a microcontroller unit, a single processor, multiple processors, or graphics processing units capable of parallel computations, or others) that is programmed using firmware and/or software instructions to perform the functions recited herein. The RAM 250 may be implemented in a Dynamic Random Access Memory (DRAM), a Static Random Access Memory (SRAM), or the combination thereof for storing necessary data in the execution, such as variables, data tables, data abstracts, and so on. The communications I/F 260 may be a Local Area Network (LAN) module, a wireless LAN module, a Bluetooth module, a 2G/3G/4G/5G telephony communications module, or any combination thereof for communicating with the server 130 in the flash-memory research laboratory through the networks 100. The NAND-flash storage device 220 (may be referred to as a device side) includes the NAND-flash module 230 and the flash controller 240, which accesses to data stored in the NAND-flash module 230 according to commands issued by the processing unit 210. Specifically, the flash controller 240 may include a microcontroller unit (MCU) and the MCU when loading and executing relevant program codes completes designated functions in coordination with other components in the flash controller 240. For example, the MCU drives a host I/F to receive host commands with necessary user data from the processing unit 210 and drives a flash I/F to read data from designated addresses of the NAND-flash module 230, program data into designated addresses of the NAND-flash module 230, erase data from designated addresses of the NAND-flash module 230, and so on, according to the host command. The MCU performs background operations, such as a garbage collection (GC) process, a wear-leveling (WL) process, etc., to improve the performance of the NAND-flash module 230.

The processing unit 210 and the host interface (I/F) of the flash controller 240 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The flash I/F of the flash controller 240 and the flash module 230 may communicate with each other by a Double Data Rate (DDR) protocol, such as Open NAND Flash Interface (ONFI), DDR Toggle, or others. The flash I/F may use several electronic signals run on physical wires including data lines, a clock signal line and control signal lines for coordinating the command, address and data transfer between the flash controller 240 the NAND-flash module 230. The data lines may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 3:
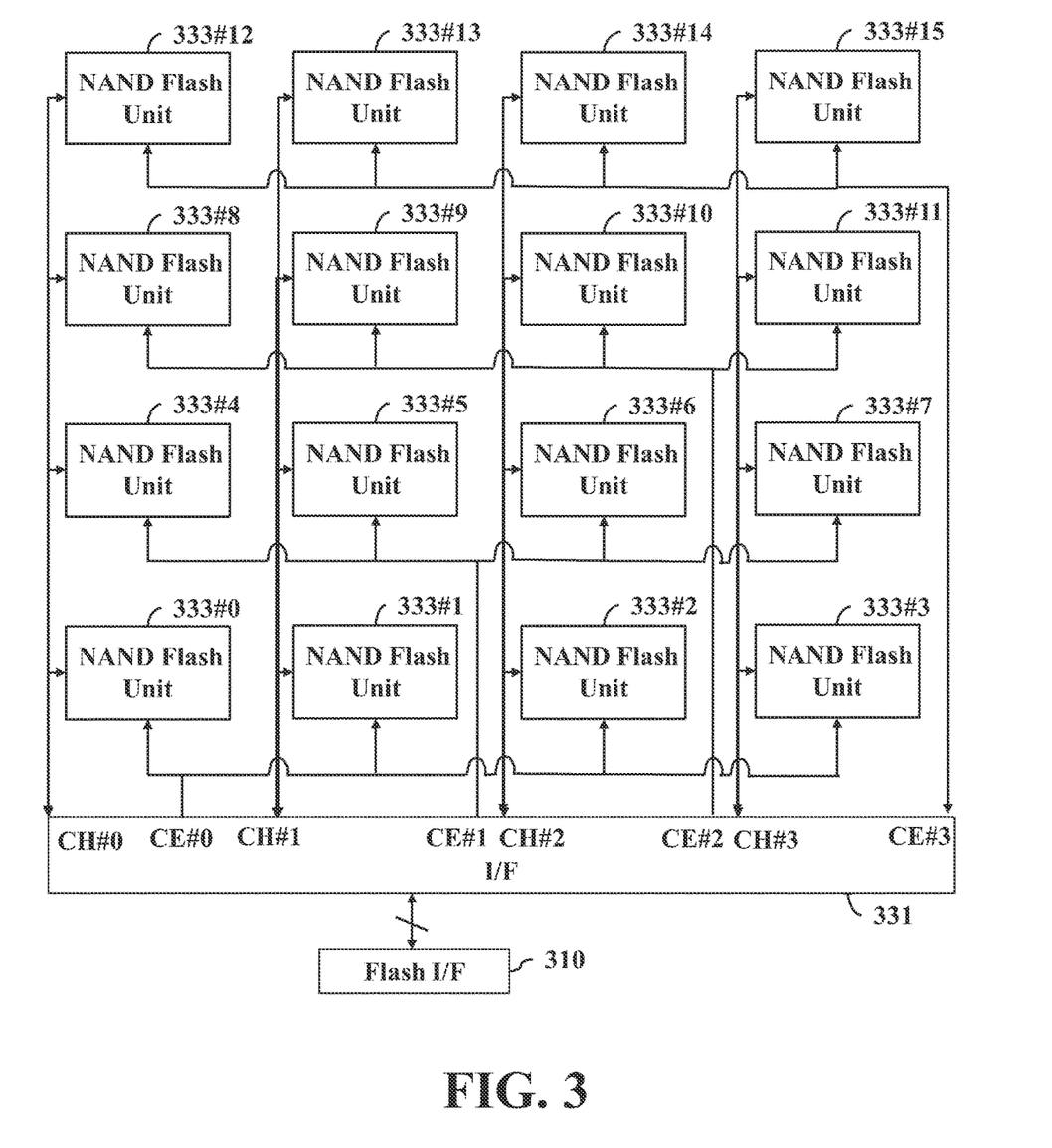
FIG. 3 is a schematic diagram illustrating a NAND-flash module according to an embodiment of the invention.

The NAND-flash module 230 provides huge storage space typically in hundred Gigabytes (GB), or even several Terabytes (TB), for storing a wide range of user data, such as high-resolution images, video files, etc. The NAND-flash module 230 includes control circuits and memory arrays containing memory cells that can be configured as Single Level Cells (SLCs), Multi-Level Cells (MLCs), Triple Level Cells (TLCs), Quad-Level Cells (QLCs), or any combinations thereof. Refer to FIG. 3. The I/F 331 in the NAN-flash module 230 may include four I/O channels (hereinafter referred to as channels) CH#0 to CH#3 and each is connected to four NAND flash units, for example, the channel CH#0 is connected to the NAND flash units 333#0, 333#4, 333#8 and 333#12. Each NAND flash unit can be packaged in an independent die. The flash I/F 139 may issue one of the CE signals CE#0 to CE#3 through the I/F 331 to activate the NAND flash units 333#0 to 333#3, the NAND flash units 333#4 to 333#7, the NAND flash units 333#8 to 333#11, or the NAND flash units 333#12 to 333#15, and read data from or program data into the activated NAND flash units in parallel.

When each memory cell in one physical block is configured as SLC to store two states, each physical wordline of the physical bock stores user data of single-pages, which requires one RV to determine which of the two states that the charges in each SLC falls within. When each memory cell in one physical block is configured as MLC to store four states, each physical wordline of the physical bock stores user data of dual-pages (each dual-page includes a most significant bit/MSB page and a least significant bit/LSB page), which requires three RVs to determine which of the four states that the charges in each MLC falls within. When each memory cell in one physical block is configured as TLC to store eight states, each physical wordline of the physical bock stores user data of triple-pages (each triple-page includes an MSB page, a center significant bit/CSB page and an LSB page), which requires seven RVs to determine which of the eight states that the charges in each TLC falls within. When each memory cell in one physical block is configured as QLC to store sixteen states, each physical wordline of the physical bock stores user data of quadruple-pages (each quadruple-page includes a top significant bit/TSB page, an MSB page, a CSB page and an LSB page), which requires fifteen RVs to determine which of the sixteen states that the charges in each QLC falls within.

For different types of physical pages, the supplier of the NAND-flash module 230 provides recommendation RVs, thereby enabling the flash controller 240 to read data from the memory cells in the NAND-flash module 230 accordingly. For example, the supplier of the NAND-flash module 230 may provide the following recommendation RVs {0.8V, 1.4V, 2.4V, 3.2V, 3.9V, 4.8V, 5.7V} to advise the flash controller 240 to read data from the MSB, CSB and LSB pages of the memory cells configured as TLCs accordingly.

Figure 4:
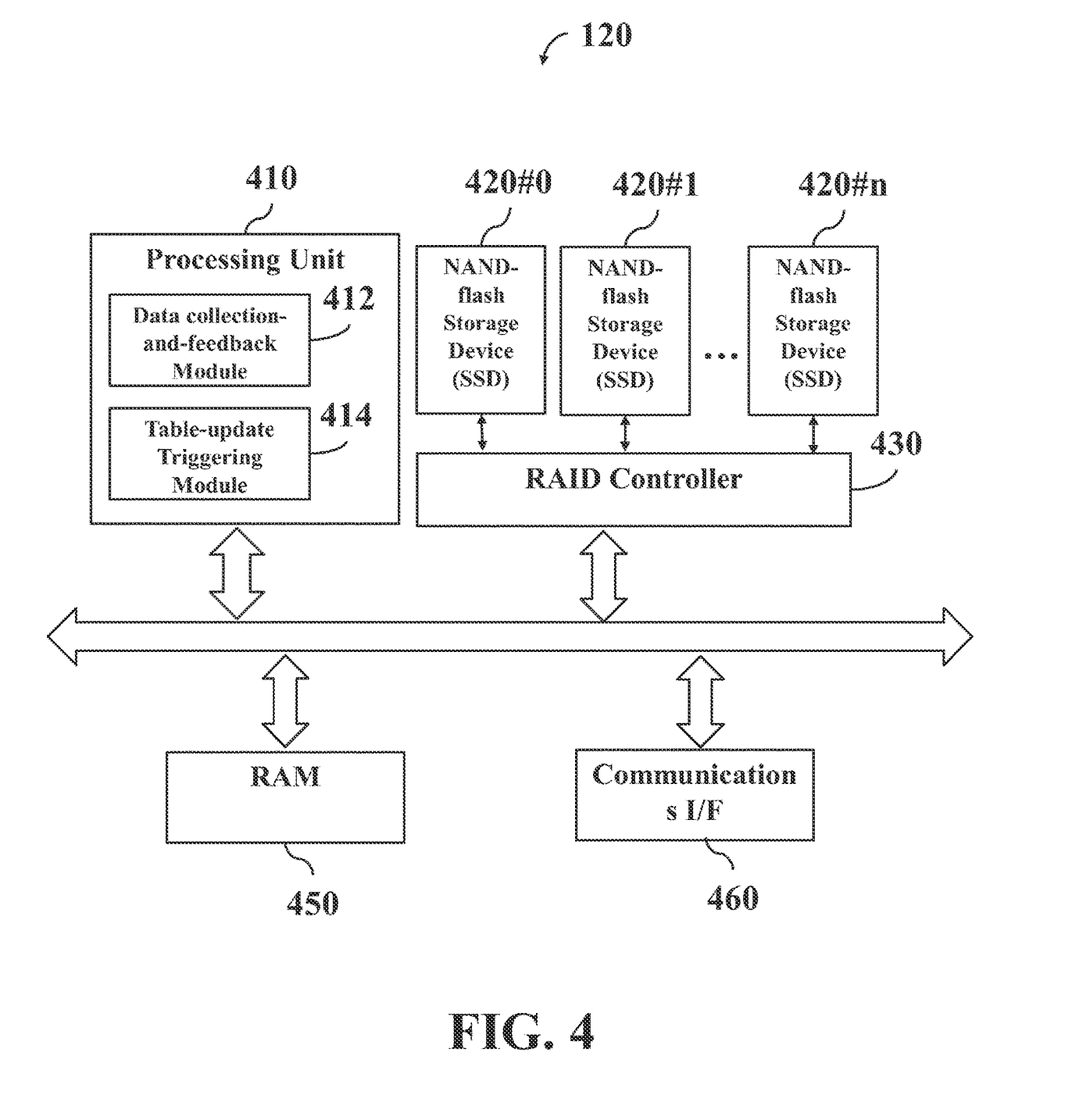
FIG. 4 is a block diagram of a cloud storage system according to an embodiment of the invention.

Refer to FIG. 4 showing an embodiment of the hardware architecture of the cloud storage system 120. The cloud storage system 120 may be equipped with the processing unit 410, the RAM 450, the communications I/F 460 and the RAID controller 430, and the RAID controller 430 is connected to multiple SSDs 420#0 to 420#n (may be referred to as the NAND-flash storage devices collectively). The functions of the processing unit 410, the RAM 450, the communications I/F 460 and the SSDs 420#0 to 420#n are similar to those of the processing unit 210, the RAM 250, the communications I/F 260 and the SSDs 220 in FIG. 2, respectively, and are not repeated herein for brevity. The RAID controller 430 may organize the SSDs 420#0 to 420#n into a RAID group. In some embodiments, two or more SSDs (n>=2) may be configured to RAID 1 to consist of data mirroring, without parity or striping. Data is written identically to the two or more SSDs, thereby producing a mirrored set of SSDs. Any read request can be serviced by any SSD in the set. In alternative embodiments, two or more SSDs (n>=2) may be configured to RAID 2 to consist of bit-level striping with dedicated Hamming-code parity. Hamming-code parity is calculated across corresponding bits and stored on at least one parity SSD. In still alternative embodiments, three or more drives (n>=3) may be configured to RAID 5 to consist of chunk-level striping with distributed parity. Parity information is distributed among the SSDs, requiring all SSDs but one to be present to operate. Upon failure of a single SSD, subsequent reads can be calculated from the distributed parity such that no data is lost. In still alternative embodiments, four or more SSDs (n>=4) may be configured to RAID 6 to consist of chunk-level striping with double distributed parity. Parity information is distributed among the SSDs, requiring all drives but two to be present to operate. Double parity provides fault tolerance up to two failed SSDs.

Figure 5:
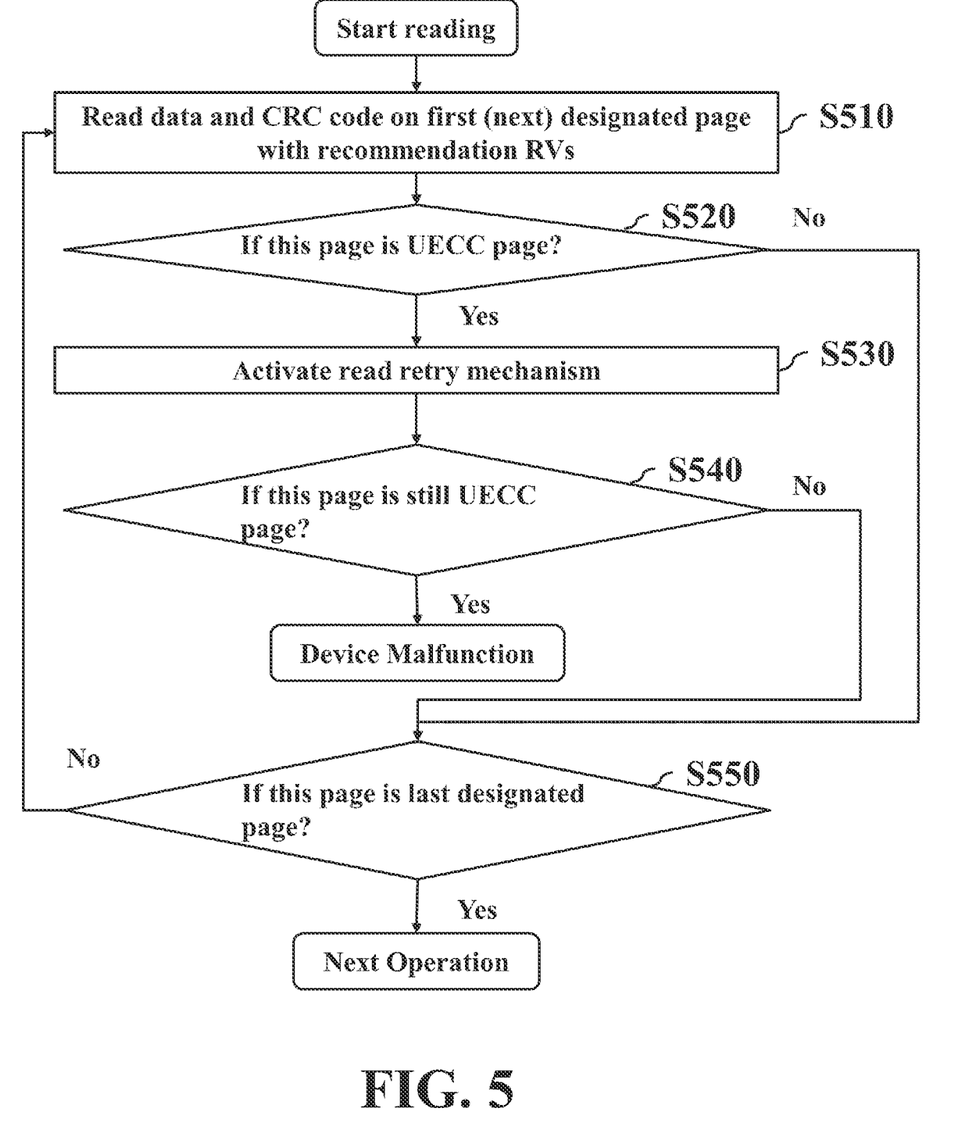
FIG. 5 is a flowchart illustrating a method for reading data according to some implementations.

As the programming/erasing cycles increases, the ambient temperature changes, and the number of storage times increases during the NAND-flash module 230 operates, the stability of the data stored in the NAND-flash module 230 would deteriorate. In some implementations, the supplier of the NAND-flash module 230 provides a read retry table in addition to the above recommendation RVs, which records multiple sets of RV parameters. Each set of RV parameters is related to an extreme case. In the read retry mechanism, the flash controller 240 repeatedly executes a loop for attempting to read data with one set of RV parameters until the read data is correct or all sets of RV parameters have been tried. The read retry mechanism operates like a blind-try procedure. Refer to FIG. 5 illustrating a flowchart of a method for reading data, performed by the MCU in the flash controller 240, which drives the flash I/F in the flash controller 240 to read data from one or more designated pages of the NAND-flash module 230 according to a host read command issued by the host side. The details are as follows:

Step S510: The flash I/F is driven with the recommendation RVs provided by the supplier of the NAND-flash module 230 to read data and Cyclic Redundancy Check (CRC) code on the first page or the next designated page of the NAND-flash module 230, which corresponds to a designated memory-cell type.

Step S520: It is determined whether the read page is an uncorrectable error correction code (UECC) page. If so, the process proceeds to step S530; otherwise, the process proceeds to step S550. Specifically, the MCU can determine whether the read data on this page is correct with the CRC code. If the read data passes the examination, then it means that this page is a correct page. If not, the MCU activates the error correction procedure to attempt to correct error bits in the read page with the corresponding error correcting code (ECC). If the correction is successful, then this page becomes a correct page. If the correction fails, then this page is marked as a UECC page.

Step S530: The read retry mechanism is activated. The read retry mechanism repeatedly executes a loop for attempting to read data with one set of RV parameters corresponding to the designated memory-cell type in the read retry table until the read data is correct or all sets of RV parameters corresponding to the designated memory-cell type in the read retry table have been tried.

Step S540: It is determined whether the read page is still a UECC page. If so, the process ends and enters the device malfunction state; otherwise, the process proceeds to step S550. Specifically, when all sets of RV parameters have been tried and error bits in the read page cannot be corrected, the read page is determined as a UECC page.

Step S550: It is determined whether the read page is the last designated page. If so, the process ends and enters a next operation state; otherwise, the process proceeds to step S510 to read the next designated page.

However, because the RV parameters in the read retry table are associated with extreme cases, the success rate of the read retry mechanism is low. Besides, too many iterations of the adjustment-and-verification loop as described above would instantly slow down the reading speed, resulting in poor data-read performance.

In order to avoid starting the read retry mechanism as much as possible, an embodiment of the present invention introduces multiple optimization RV tables and a method for using the optimization RV tables. Although the specification describes the shortcomings of the above implementation, this is only used to illustrate the inspiration of embodiments of the present invention as follows. Those artisans can apply the technical solutions to solve other technical problems or be applicable to other technical environments, and the invention should not be limited thereto. The manufacturer of the NAND-flash storage device 220 stores these optimization RV tables in designated locations of the NAND-flash module 230 before leaving the factory. Each optimization RV table is associated with one memory-cell type and includes multiple records. Each record includes a set of RV parameters (which may be represented by RV offset values or other representations) and a set of environmental parameters associated with this set of RV parameters. For example, when each memory cell in the NAND-flash module 230 can be configured as SLC, MLC or TLC, the NAND-flash module 230 stores the SLC, the MLC and the TLC optimization RV tables. Each RV offset value may be represented by an adjustment scale, for example, "0" represents no adjustment, "+1" represents an increase of 0.01V, "+2" represents an increase of 0.02V, "−1" represents a decrease of 0.01V, "−2" represents a decrease of 0.02V, and so on. The environmental parameters may include such as the data endurance, the data retention, the temperature swing, the read disturbance, the NAND-flash ID, etc. The data endurance indicates the degree of usage and may be expressed by the average of erase count, which is the average of erase counts of all physical blocks. The data retention indicates the data storage time, which may be represented by a time scale, for example, "0.25" means less than or equal to one quarter, "0.5" means less than or equal to half a year but greater than one quarter, "1" means less than or equal to one year but greater than half a year, and so on. The temperature swing indicates the temperature range during operation, which may be represented by a temperature scale, for example, "0" represents 0° C.~9.99° C., "1" represents 10° C.~19.99° C., and so on. The read disturbance indicates the read frequency and may be expressed by the average of read count, which is the average of read counts of all physical blocks. The NAND-flash ID carries information about such as the manufacturer, the product type, the manufacturing date, etc. Taking the MLC optimization RV table as an example, the data structure of each record is expressed as {RV0, RV1, RV2, EP0, EP1, EP2, EP3, EP4}, where "RV0" to "RV2" represent three voltage offset values, and "EP0" to "EP4" respectively represent the environmental parameters about the data endurance, the data retention, the temperature swing, the read disturbance and the NAND-flash ID. Taking the TLC optimization RV table as an example, the data structure of each record is expressed as {RV0, RV1, RV2, RV3, RV4, RV5, RV6, EP0, EP1, EP2, EP3, EP4}, where "RV0" to "RV6" represent seven voltage offset values, and "EP0" to "EP4" respectively represent the environmental parameters about the data endurance, the data retention, the temperature swing, the read disturbance and the NAND-flash ID.

In addition to the optimization RV tables, the flash controller 240 stores the current environmental parameters in the designated region of the NAND-flash module 230 to reflect the current operation statuses of the NAND-flash module 230.

Figure 6:
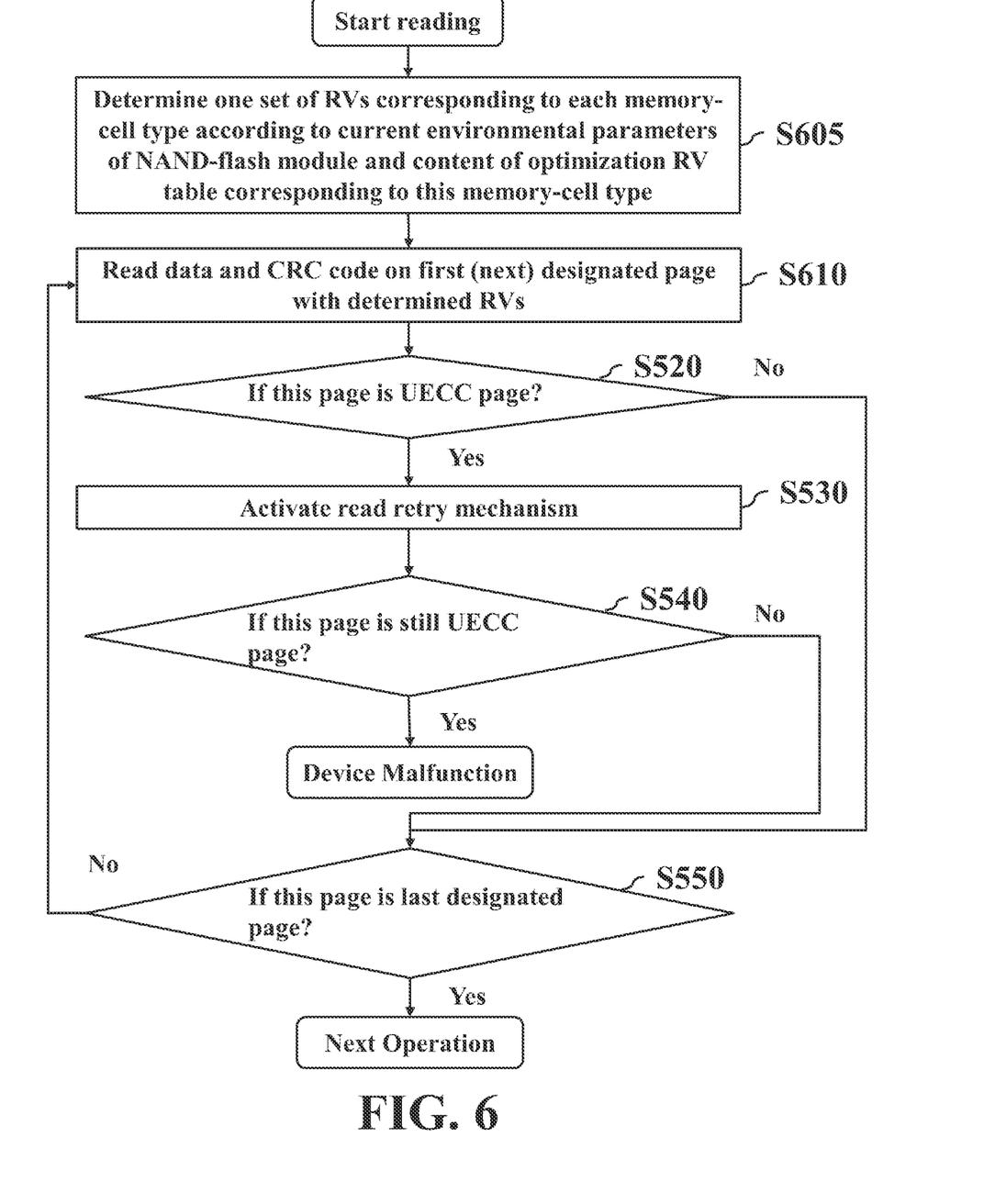
FIG. 6 is a flowchart illustrating a method for reading data according to an embodiment of the invention.

Refer to FIG. 6 of a flowchart for illustrating the method for reading data, which is performed by the MCU in the flash controller 240. The details are as follows:

Step S605: One set of RVs for each memory-cell type is determined according to the current environmental parameters of the NAND-flash module 230 and the content of optimization RV table corresponding to this memory-cell type. Specifically, before actually reading data (that is, before entering the loop of actually reading data), the MCU obtains the current environmental parameters of the NAND-flash module 230 and searches the relevant optimization RV table for one set of RV offset values adapted to the current environmental parameters for each memory-cell type. The memory-cell types may include SLC, MLC, TLC, QLC, or any combinations thereof. The current environmental parameters of the NAND-flash module 230 may include the data endurance, the data retention, the temperature swing, the read disturbance, the NAND-flash identifier (ID), or any combinations thereof. The data endurance, the data retention, the temperature swing and the read disturbance of the NAND-flash module 230 may be respectively represented by the current average of erase count, the current data storage time, the current temperature range during operation and the current average of read count of the NAND-flash module 230. The MCU may filter out the records that are not related to the NAND-flash ID of the NAND-flash module 230 from the optimization RV tables; find the matching record having the closet environmental parameters to the current environmental parameters among the remaining records of each optimization RV table; and generate one set of RVs for each memory-cell type according to the content of corresponding matching record. The MCU may apply any of the similarity comparison algorithms, the decision trees and the heuristic rules known to those artisans to find one set of environmental parameters closet to the current environmental parameters among multiple sets of environmental parameters.

Subsequently, the RVs are determined according to the found set of RV offset values. The RVs are determined by the exemplary formula as follows:

$$RV_{adj,i} = RV_{rcm,i} + RV_{off,i}$$

$RV_{adj,i}$ indicates the $i^{th}$ final RV, $RV_{rcm,i}$ indicates the $i^{th}$ recommendation RV provided by the supplier of the NAND-flash module 230, $RV_{off,i}$ indicates the found $i^{th}$ RV offset value, i is an integer ranging from 0 to $RV_{max}-1$, $RV_{max}$ indicates the total number of RV offset values corresponding to a designated memory-cell type (for example, the total number of RV offset values corresponding to TLC). Assume that the recommendation RVs for reading data stored in a TLC block are {0.8V, 1.4V, 2.4V, 3.2V, 3.9V, 4.8V, 5.7V} and the found RV offset values are {+1, +1, 0, 0, 0, 0, −2}: The final RVs for reading data stored in a TLC block are determined as {0.81V, 1.41V, 2.4V, 3.2V, 3.9V, 4.8V, 5.68V}. The optimization RV tables and their usage not only reduces the bit error rate (BER), but also avoids frequent activation of the read retry mechanism.

Step S610: The flash I/F is driven with the determined RVs to read data and CRC code on the first page or the next designated page of the NAND-flash module 230.

For the technical details of steps S520 to S550 in FIG. 6, reference may be made to the corresponding paragraphs related to FIG. 5, and will not repeated herein for brevity.

However, the RV parameter sets of the optimization RV tables stored in the NAND-flash module 230 may not be suitable under certain operating conditions, or some operating conditions that the NAND-flash module 230 operates may be out of the scope of multiple sets of environmental parameters that are originally provided in the optimization RV tables. To address the problems as described above, an embodiment of the invention introduces a method for dynamically updating the optimization RV tables, which modifies the RV parameters corresponding to a specific environmental parameter set in one or more designated optimization RV tables with new ones, or appends RV parameter sets corresponding to the environmental parameter sets that are newly detected to designated one or more optimization RV tables. Although the specification describes the shortcomings of the above implementation, this is only used to illustrate the inspiration of embodiments of the present invention as follows. Those artisans can apply the technical solutions to solve other technical problems or be applicable to other technical environments, and the invention should not be limited thereto.

Refer to the block diagram as shown in FIG. 2. After one or more host read commands are executed successfully, the MCU of the flash controller 240 when loading and executing program code of the data-read monitoring module 242 generates read-performance data and stores it in the RAM of the flash controller 240 as a data-read transaction. The read-performance data includes the current environmental parameters of the NAND-flash module 230, the specific memory-cell type and the bit error rate (BER), which is used to evaluate the quality of this data-read transaction. A higher BER means a worse quality.

Figure 7:
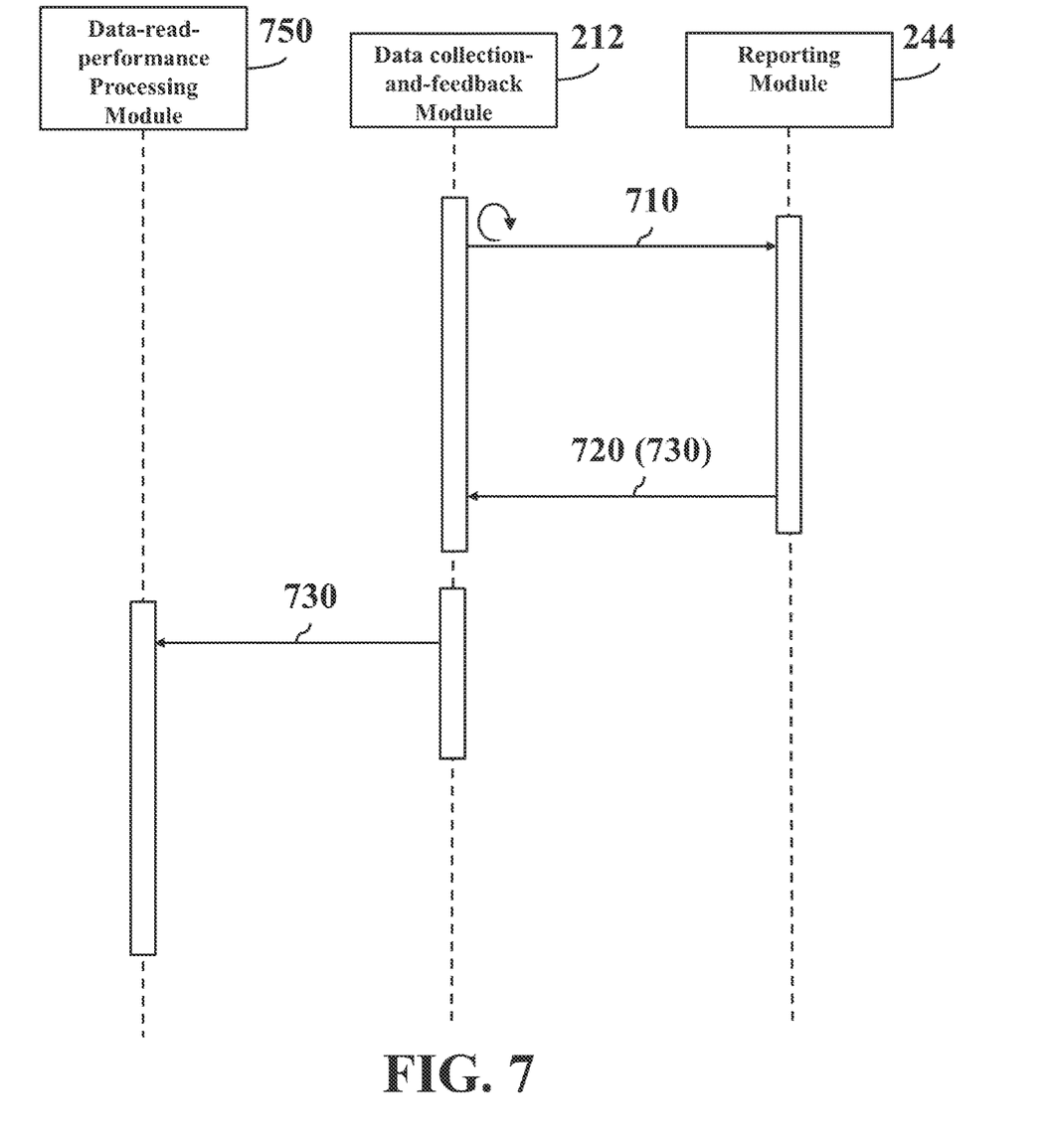
FIG. 7 is a sequence diagram for collecting and reporting read-performance data according to an embodiment of the invention.

Refer to the block diagram as shown in FIG. 2 and the sequence diagram as shown in FIG. 7. In order to complete the gathering of read-performance data, the MCU of the flash controller 240 when loading and executing program code of the reporting module 244 in a background operation monitors whether the processing unit 210 requests the flash controller 240 for the read-performance data. The processing unit 210 periodically loads and executes program code of the data collection-and-feedback module 212 to issue the request 710 to the reporting module 244 for the read-performance data through the native bus. After listening to the request 710, the reporting module 244 reads all data-read transactions from the RAM in the flash controller 240 and transmits the reply 720 carrying the data-read transactions 730 to the data collection-and-feedback module 212 through the native bus. After gathering the predefined number of data-read transactions 730, the data collection-and-feedback module 212 transmits the data-read transactions 730 to the data-read-performance processing module 750 running on the server located in the flash research laboratory through the networks 100. An engineer selects the read-data transactions whose BER exceeding a threshold by manipulating the man-machine interface (MMI) provided by the data-read-performance processing module 750 and uses the artificial intelligence (AI) engine, the statistical tools, or other algorithms to mark the environmental parameters with bad settings according to the content of selected data-read transactions. The engineer may design and conduct experiments according to the content of environmental parameters with bad settings and modify the corresponding optimization RV table according to the experimental results. The engineer may update one record in the corresponding optimization RV table to change RV offset values of the designated set corresponding to the designated environmental parameter set. Or, the engineer may insert one record including a new set of environmental parameters and its associated set of RV offset values in the corresponding optimization RV table.

Figure 8:
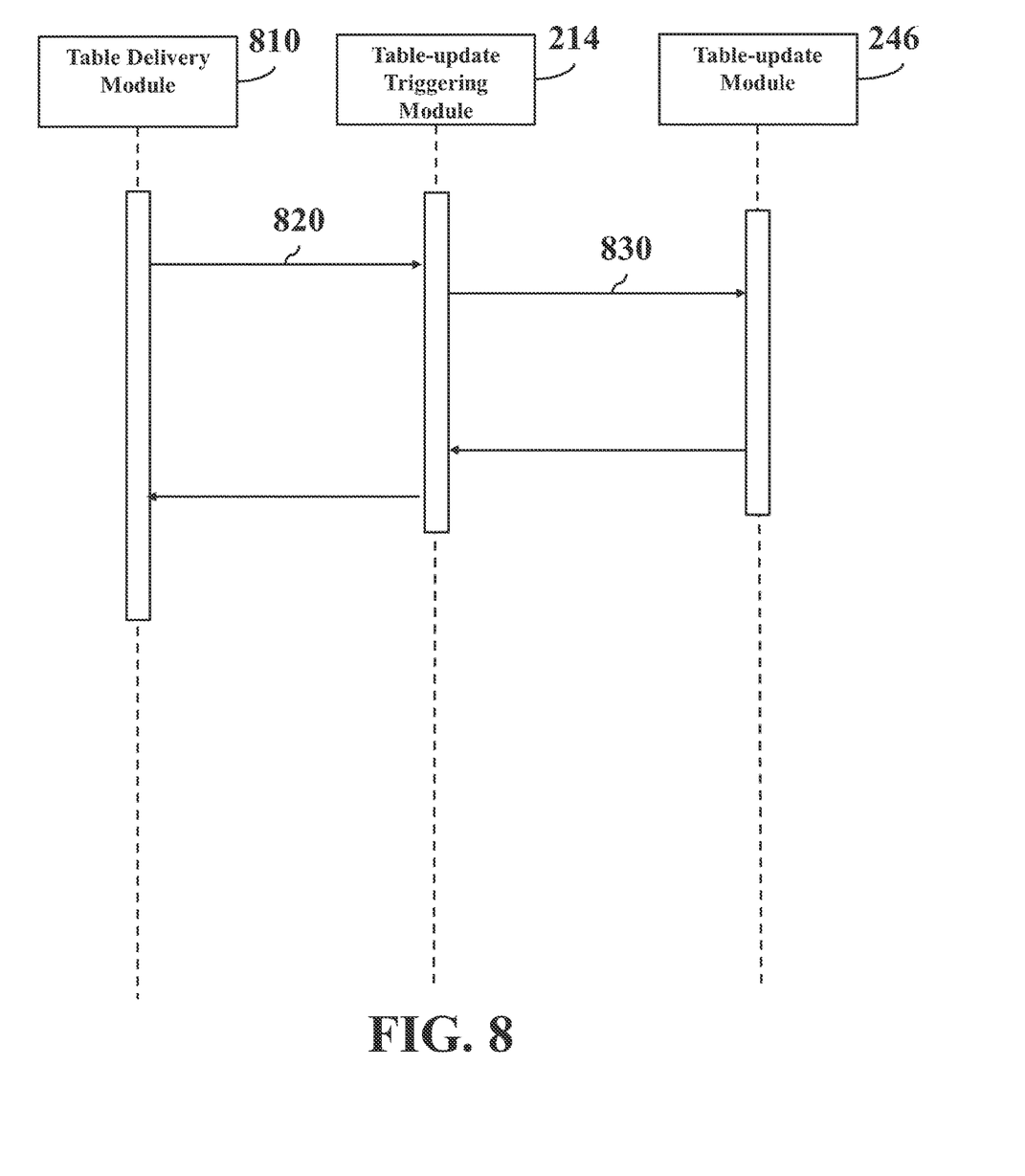
FIG. 8 is a sequence diagram for updating optimization read voltage table according to an embodiment of the invention.

Refer to the block diagram as shown in FIG. 2 and the sequence diagram as shown in FIG. 8. In order to complete the update of the optimization RV table, the processing unit 210 when loading and executing program code of the table-update triggering module 214 in a background operation monitors whether the server 130 located in the flash research laboratory requests to update the optimization RV tables; and the MCU of the flash controller 240 when loading and executing program code of the table-update module 246 in a background operation monitors whether the processing unit 210 requests to update the optimization RV table of a designated memory-cell type. After the optimization RV table of a designated memory-cell type is updated completely, the processing unit of the server 130 when loading and executing program code of the table delivery module 810 issues the request 820, which carries an identifier of the optimization RV table to be updated and the updated records of the optimization RV table, to the table-update triggering module 214 for updating the optimization RV table of the designated memory-cell type through the networks 100. After listening to the request 820, the table-update triggering module 214 issues the request 830 carrying the identifier of the optimization RV table to be updated (which includes information about the designated memory-cell type) to the table-update module 246 and transmits the updated records of the optimization RV table to the table update module 246 through the native bus. After receiving the request 830 for updating the optimization RV table of the designated memory-cell type and the updated records of the optimization RV table, the table-update module 246 drives the flash I/F in the flash controller 240 to program the updated records of the optimization RV table into the designated location of the NAND-flash module 230, so that the forthcoming data-read operations corresponding to the designated memory-cell type adjusts the RVs according to the updated optimization RV table. For the technical details of the data-read operations using the updated optimization RV table of the designated memory-cell type, those artisans may refer to the descriptions related of FIG. 6.

Although the above paragraphs include examples of the data collection-and-feedback module 212 and the table-update triggering module 214 running on the computation equipment 20 as shown in FIG. 2 to describe the functions that the computation equipment 20 provides, and the interactions of the computation equipment 20 with the server 130 located in the flash research laboratory, the technical details described herein are also applicable to the data collection-and-feedback module 412 and the table-update triggering module 414 running on the cloud storage system 120 as shown in FIG. 4. Any of the SSDs 420#0 to 420#n of the cloud storage system 120 can be realized by the NAND-flash storage device 220 as shown in FIG. 2, thus, the flash controller in any of the SSDs 420#0 to 420#n performs the functions of the data-read monitoring module 242, the reporting module 244 and the table-update module 246.

Some or all of the aforementioned embodiments of the method of the invention may be implemented in a computer program, such as an application run on the host side, a driver for a dedicated hardware, a firmware translation layer (FTL) run on the device side, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier, which may be located in a network server accessible via a network such as the Internet, or any other suitable carrier.

A computer-readable storage medium includes volatile and non-volatile, removable and non-removable media implemented in any method or technology for storage of information such as computer-readable instruction, data structures, program modules, or other data. A computer-readable storage medium includes, but is not limited to, RAM, ROM, EEPROM, flash memory or other memory, CD-ROM, digital versatile disks (DVD), Blue-ray disk or other optical storage, magnetic cassettes, magnetic tape, magnetic disk or other magnetic storage devices, or any other medium which can be used to store the desired information and may be accessed by an instruction execution system. Note that a computer-readable medium can be paper or other suitable medium upon which the program is printed, as the program can be electronically captured via, for instance, optical scanning of the paper or other suitable medium, then compiled, interpreted, or otherwise processed in a suitable manner, if necessary, and then stored in a computer memory.

Although the embodiment has been described as having specific elements in FIGS. 2 to 4, it should be noted that additional elements may be included to achieve better performance without departing from the spirit of the invention. Each element of FIGS. 2 to 4 is composed of various circuitries and arranged operably to perform the aforementioned operations. While the process flows described in FIGS. 5 to 6 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for dynamically updating an optimization read voltage (RV) table, performed by a micro-controller unit of a flash controller, comprising:
   receiving a first request for read-performance data from a host side;
   obtaining a data-read transaction and transmitting the data-read transaction to the host side in response to the first request, thereby enabling the data-performance transaction to be used in an update of the optimization RV table for a designated memory-cell type, wherein the data-read transaction comprises a first current environmental parameter of a NAND-flash module, the designated memory-cell type and a bit error rate (BER), and the first current environmental parameter of the NAND-flash module describes a first data storage characteristic currently measured for the NAND-flash module;
   receiving a second request for updating the optimization RV table for the designated memory-cell type from the host side; and
   programming a plurality of records of an updated optimization RV table for the designated memory-cell type into a designated location of the NAND-flash module after listening to a in response to the second request, wherein each record comprises one set of RV parameters and a first environmental parameter associated with the set of RV parameters, and the first environmental parameter describes a second data storage characteristic applied for a specific NAND-flash module.

2. The method of claim 1, comprising:
   determining one set of RVs for the designated memory-cell type according to a second current environmental parameter of a NAND-flash module and content of the updated optimization RV table, wherein the second current environmental parameter of the NAND-flash module describes a second data storage characteristic currently measured for the NAND-flash module; and
   reading data on a page corresponding to the designated memory-cell type from the NAND-flash module with the set of RVs.

3. The method of claim 1, wherein the designated memory-cell type is Single Level Cell (SLC), Multi-Level Cell (MLC), Triple Level Cell (TLC), or Quad-Level Cell (QLC).

4. The method of claim 2, comprising:
   filtering out records that are not related to a NAND-flash identifier (ID) of the NAND-flash module from the updated optimization RV table;
   finding a matching record comprising a second environmental parameter closet to the second current environmental parameter from remaining records of the updated optimization RV table, wherein the second environmental parameter describes a third data storage characteristic applied for the NAND-flash module; and
   generating the set of RVs according to one set of RV parameters of the matching record.

5. The method of claim 1, wherein the first current environmental parameter of the NAND-flash module comprises a current average of erase count, a current data storage time, a current temperature range during operation and a current average of read count currently measured for the NAND-flash module, and the first environmental parameter of each record comprises an average of erase count, a data storage time, a temperature range during operation and an average of read count applied for the specific NAND-flash module.

6. The method of claim 1, wherein each set of RV parameters comprises a plurality of RV offset values and the set of RVs are determined by a formula as follows:

$$RV_{adj,i} = RV_{rem,i} + RV_{off,i}$$

$RV_{adj,i}$ indicates ith RV of the set of RVs, $RV_{rem,i}$ indicates ith recommendation RV provided by a supplier of the NAND-flash module, $RV_{off,i}$ indicates ith RV offset value in the matching record, i is an integer ranging from 0 to $RV_{max}-1$, $RV_{max}$ indicates a total number of RV offset values corresponding to the designated memory-cell type.

7. A non-transitory computer-readable storage medium having stored therein program code that, when loaded and executed by a micro-controller unit (MCU) of a flash controller, causes the MCU to:
   receive a first request for read-performance data from a host side;
   obtain a data-read transaction and reply with transmit the data-read transaction to the host side in response to the first request, thereby enabling the data-performance transaction to be used in an update of an optimization read voltage (RV) table for a designated memory-cell type, wherein the data-read transaction comprises a first current environmental parameter of a NAND-flash module, the designated memory-cell type and a bit error rate (BER), and the first current environmental parameter of the NAND-flash module describes a first data storage characteristic currently measured for the NAND-flash module;
   receive a second request for updating the optimization RV table for the designated memory-cell type from the host side; and
   program a plurality of records of an updated optimization RV table for the designated memory-cell type into a designated location of the NAND-flash module after listening to a in response to the second request, wherein each record comprises one set of RV parameters and a first environmental parameter associated with the set of RV parameters, and the first environmental parameter describes a second data storage characteristic applied for a specific NAND-flash module.

8. The non-transitory computer-readable storage medium of claim 7, wherein the program code that, when loaded and executed by the MCU of the flash controller, causes the MCU to:
  determine one set of RVs for the designated memory-cell type according to a second current environmental parameter of a NAND-flash module and content of the updated optimization RV table, wherein the second current environmental parameter of the NAND-flash module describes a second data storage characteristic currently measured for the NAND-flash module; and
  read data on a page corresponding to the designated memory-cell type from the NAND-flash module with the set of RVs.

9. The non-transitory computer-readable storage medium of claim 7, wherein the designated memory-cell type is Single Level Cell (SLC), Multi-Level Cell (MLC), Triple Level Cell (TLC), or Quad-Level Cell (QLC).

10. The non-transitory computer-readable storage medium of claim 8, wherein the program code that, when loaded and executed by the MCU of the flash controller, causes the MCU to:
  filter out records that are not related to a NAND-flash identifier (ID) of the NAND-flash module from the updated optimization RV table;
  find a matching record comprising a second environmental parameter closet to the second current environmental parameter from remaining records of the updated optimization RV table, wherein the second environmental parameter describes a third data storage characteristic applied for the NAND-flash module; and
  generate the set of RVs according to one set of RV parameters of the matching record.

11. The non-transitory computer-readable storage medium of claim 7, wherein the first current environmental parameter of the NAND-flash module comprises a current average of erase count, a current data storage time, a current temperature range during operation and a current average of read count currently measured for the NAND-flash module, and the first environmental parameter of each record comprises an average of erase count, a data storage time, a temperature range during operation and an average of read count applied for the specific NAND-flash module.

12. The non-transitory computer-readable storage medium of claim 7, wherein each set of RV parameters comprises a plurality of RV offset values and the set of RVs are determined by a formula as follows:

$$RV_{adj,i}=RV_{rem,i}+RV_{off,i}$$

$RV_{adj,i}$ indicates ith RV of the set of RVs, $RV_{rem,i}$ indicates ith recommendation RV provided by a supplier of the NAND-flash module, $RV_{off,i}$ indicates ith RV offset value in the matching record, i is an integer ranging from 0 to $RV_{max}-1$, $RV_{max}$ indicates a total number of RV offset values corresponding to the designated memory-cell type.

13. The non-transitory computer-readable storage medium of claim 7,
  wherein the program code that, when loaded and executed by the MCU of the flash controller, causes the MCU to:
  when the page is determined as an uncorrectable error correction code (UECC) page, activate a read retry mechanism for repeatedly executing a loop for attempting to read data on the page with one set of RV parameters in a read retry table until read data is correct or all sets of RV parameters in the read retry table have been tried.

14. An apparatus for reading data with an optimization read voltage (RV) table, comprising:
  a flash interface (I/F), coupled to a NAND-flash module; and
  a microcontroller unit (MCU), coupled to the flash I/F, arranged operably to: receive a first request for read-performance data from a host side; obtain a data-read transaction and transmit the data-read transaction to the host side in response to the first request, thereby enabling the data-performance transaction to be used in an update of the optimization RV table for a designated memory-cell type, wherein the data-read transaction comprises a first current environmental parameter of a NAND-flash module, the designated memory-cell type and a bit error rate (BER), and the first current environmental parameter of the NAND-flash module describes a first data storage characteristic currently measured for the NAND-flash module; receive a second request for updating the optimization RV table for the designated memory-cell type from the host side; and drive the flash I/F to program a plurality of records of an updated optimization RV table for the designated memory-cell type into a designated location of the NAND-flash module in response to the second request, wherein each record comprises one set of RV parameters and a first environmental parameter associated with the set of RV parameters, and the first environmental parameter describes a second data storage characteristic applied for a specific NAND-flash module.

15. The apparatus of claim 14, wherein the MCU is arranged operably to: determine one set of RVs for the designated memory-cell type according to a second current environmental parameter of a NAND-flash module and content of the updated optimization RV table, wherein the second current environmental parameter of the NAND-flash module describes a second data storage characteristic currently measured for the NAND-flash module; and drive the flash I/F to read data on a page corresponding to the designated memory-cell type from the NAND-flash module with the set of RVs.

16. The apparatus of claim 14, wherein the designated memory-cell type is Single Level Cell (SLC), Multi-Level Cell (MLC), Triple Level Cell (TLC), or Quad-Level Cell (QLC).

17. The apparatus of claim 15, wherein the MCU is arranged operably to: filter out records that are not related to a NAND-flash identifier (ID) of the NAND-flash module from the updated optimization RV table; find a matching record comprising a second environmental parameter closet to the second current environmental parameter from remaining records of the updated optimization RV table, wherein the second environmental parameter describes a third data storage characteristic applied for the NAND-flash module; and generate the set of RVs according to one set of RV parameters of the matching record.

18. The apparatus of claim 14, wherein the first current environmental parameter of the NAND-flash module comprises a current average of erase count, a current data storage time, a current temperature range during operation and a current average of read count currently measured for the NAND-flash module, and the first environmental parameter of each record comprises an average of erase count, a data storage time, a temperature range during operation and an average of read count applied for the specific NAND-flash module.

19. The apparatus of claim 14, wherein each set of RV parameters comprises a plurality of RV offset values and the set of RVs are determined by a formula as follows:

$$RV_{adj,i} = RV_{rem,i} + RV_{off,i}$$

$RV_{adj,i}$ indicates ith RV of the set of RVs, $RV_{rem,i}$ indicates ith recommendation RV provided by a supplier of the NAND-flash module, $RV_{off,i}$ indicates ith RV offset value in the matching record, i is an integer ranging from 0 to $RV_{max}-1$, $RV_{max}$ indicates a total number of RV offset values corresponding to the designated memory-cell type.

20. The apparatus of claim 14, wherein the MCU is arranged operably to: when the page is determined as an uncorrectable error correction code (UECC) page, activate a read retry mechanism for repeatedly executing a loop for attempting to read data through the flash I/F on the page with one set of RV parameters in a read retry table until read data is correct or all sets of RV parameters in the read retry table have been tried.

* * * * *